United States Patent [19]

Padgett et al.

[11] 4,256,974
[45] Mar. 17, 1981

[54] METAL OXIDE SEMICONDUCTOR (MOS) INPUT CIRCUIT WITH HYSTERESIS

[75] Inventors: Clarence W. Padgett, Westminster; Melvin L. Marmet, Corona, both of Calif.

[73] Assignee: Rockwell International Corporation, El Segundo, Calif.

[21] Appl. No.: 946,940

[22] Filed: Sep. 29, 1978

[51] Int. Cl.³ .................. H03K 19/092; H03K 19/094
[52] U.S. Cl. ...................................... 307/475; 307/270
[58] Field of Search ............... 307/251, 270, 279, 264, 307/DIG. 1, 205

[56] References Cited

U.S. PATENT DOCUMENTS

| | | | |
|---|---|---|---|
| 3,675,144 | 7/1972 | Zuk | 307/251 X |
| 3,755,690 | 8/1973 | Smith | 307/DIG. 1 X |
| 3,823,330 | 7/1974 | Rapp | 307/DIG. 1 X |
| 3,946,369 | 3/1976 | Pashley | 307/270 X |
| 4,023,050 | 5/1977 | Fox et al. | 307/DIG. 1 X |
| 4,031,409 | 6/1977 | Shimada et al. | 307/DIG. 1 X |
| 4,065,678 | 12/1977 | Reese et al. | 307/270 X |
| 4,097,772 | 6/1978 | Carter | 307/DIG. 1 X |
| 4,103,189 | 7/1978 | Perlegos et al. | 307/270 |
| 4,159,540 | 6/1979 | Smith et al. | 307/DIG. 1 X |
| 4,161,040 | 7/1979 | Satoh | 307/DIG. 1 X |

FOREIGN PATENT DOCUMENTS

| | | | |
|---|---|---|---|
| 458099 | 3/1975 | U.S.S.R. | 307/DIG. 1 |
| 585609 | 12/1977 | U.S.S.R. | 307/DIG. 1 |

OTHER PUBLICATIONS

Love, "In-Phase Weak-Signal Input Circuit," *IBM Tech. Discl. Bull.*, vol. 19, No. 12, p. 4673, 5/1977.

*Primary Examiner*—Larry N. Anagnos
*Attorney, Agent, or Firm*—H. Fredrick Hamann; Morland C. Fischer; Wilfred G. Caldwell

[57] ABSTRACT

An improved static metal oxide semiconductor (MOS) input circuit having particular utility as a TTL input receiver, is fabricated from enhancement and depletion-type field effect transistors (FETs). The input circuit is adapted to produce positive feedback to adjust the on-resistance ratios of some of the circuit transistor devices, whereby hysteresis is developed. By virtue of the hysteresis, an extended noise margin is provided at the circuit input terminal so that MOS logic level output signals are clearly distinguishable from one another at the circuit output terminal.

4 Claims, 5 Drawing Figures

METAL OXIDE SEMICONDUCTOR (MOS) INPUT CIRCUIT WITH HYSTERESIS

BACKGROUND OF THE INVENTION

1. Field of the Invention

This invention relates to a metal oxide semiconductor (MOS) input circuit having hysteresis to provide an increased noise margin and clearly distinguishable logic level output signals.

2. Statement of the Prior Art

Prior art input circuits such as those capable of receiving fixed TTL logic level input signals (e.g. 0.8 and 2.0 volts) and providing corresponding MOS compatible logic level output signals (0.2 and 4.0 volts), are plagued by similar problems. Examples of prior art input circuits that include the interconnection of enhancement and depletion-type field effect transistors can be found in the following U.S. Pat. Nos.:

3,761,899: Sept. 25, 1973
3,821,717: June 28, 1974
3,969,633: July 13, 1976
3,995,172: Nov. 30, 1976

Typically, in order to accommodate relatively low voltage input signals, prior art input circuits are fabricated with field effect transistors having relatively wide channel widths. As a result, the size and associated costs of the input circuit is increased. Moreover, the parasitic capacitance of the transistor devices is, accordingly, increased which undesirably slows down circuit operation. Should the input circuit be subjected to unwanted noise when the input logic level signals have a narrow voltage swing, the MOS true and false logic level output signals frequently become substantially indistinguishable from one another, so that an uncertain output state appears to exist. One way to adequately reduce the effects of noise at the input terminal of an input circuit is to develop hysteresis within the circuit. Examples of those MOS input circuits having hysteresis can be found in the following U.S. Pat. Nos.:

3,612,908: Oct. 12, 1971
3,882,331: May 6, 1975
3,904,888: Sept. 9, 1975
4,097,772: June 27, 1978

However, none of the above-identified patents shows or discloses the hereinafter claimed input circuit comprising three inverter stages, which circuit includes depletion and enhancement-type transistor devices interconnected to establish a positive feedback path so as to provide hysteresis, whereby a wide band of noise rejection is provided at the circuit input terminal.

SUMMARY OF THE INVENTION

Briefly, and in general terms, an improved static MOS input circuit is disclosed. The input circuit comprises the inter-connection of first, second and third inverter stages, each of which inverter stages including the series connection of a pair of enhancement and depletion-type field effect transistors. The circuit input terminal is connected to the first inverter stage, and the circuit output terminal is connected to the third inverter stage. The output terminal of the first inverter stage drives the enhancement-type transistor device of the third inverter stage, and the output terminal of the second inverter stage drives the depletion-type transistor device of the third inverter stage, whereby push-pull drive is provided to the third inverter stage. The input circuit also includes a pair of series connected enhancement-type field effect transistors connected in electrical parallel with the enhancement-type transistor device of the first inverter stage.

By virtue of the present input circuit configuration, a positive feedback path is established from the output terminal of the first inverter stage to the gate electrode of one of the last mentioned pair of enhancement-type transistor devices via the second inverter stage to thereby reinforce a relatively false logic level signal (e.g. ground) at the output terminal of the first inverter stage. Positive feedback enables the first inverter stage to encounter a varying on-resistance ratio, depending upon the level of the input signal, whereby the circuit develops hysteresis and improved noise immunity at the input terminal thereof. Hence, the logic level output signals at the circuit output terminal are clearly distinguishable from one another in response to relatively low voltage input signals having a narrow voltage swing therebetween.

DESCRIPTION OF THE PREFERRED EMBODIMENT

Figure 1A:
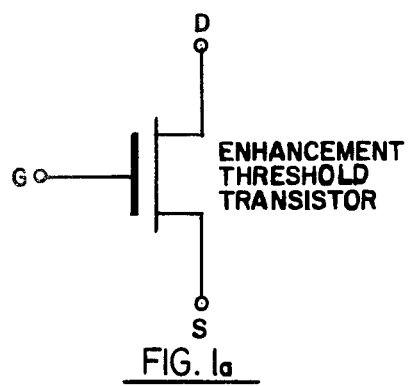
FIGS. 1a and 1b show typical electrical symbols representative of an enhancement mode threshold field effect transistor and a depletion mode threshold field effect transistor, respectively.
Figure 1B:
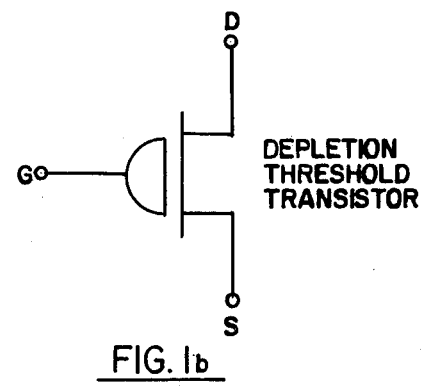

FIGS. 1a and 1b show typical electrical symbols representative of an enhancement mode threshold field effect transistor (FET) and a depletion mode threshold field effect transistor (FET), respectively. Each transistor has respective gate (G), source (S) and drain (D) electrodes. The enhancement mode threshold transistor of FIG. 1a may be commonly fabricated by (ion) implanting the channel region of an n-channel field effect transistor device with a p-type semiconductive material. That is, an enhancement mode transistor is normally rendered non-conducting. A relatively positive voltage applied across the source-gate electrode junction is required to render the enhancement mode transistor conducting. The depletion mode threshold transistor illustrated in FIG. 1b may be commonly fabricated by (ion) implanting the channel region of an n-channel field effect transistor device with an n-type semiconductive material. A depletion mode transistor or pull-up-transistor device is normally rendered conducting (and, thereby, has the electrical characteristics approximating those of both a constant current source and a load resistor).

Figure 2:
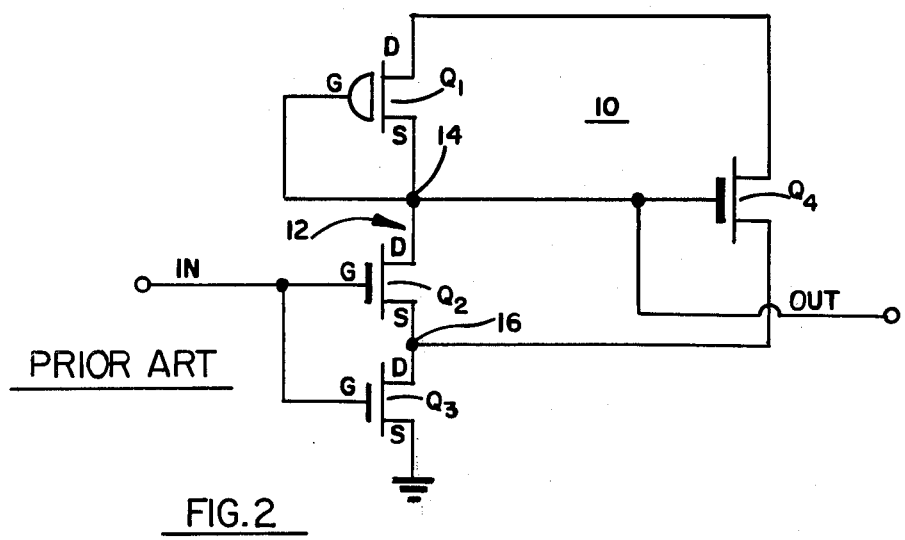
FIGS. 2 and 3 show prior art input circuits.

FIG. 2 illustrates a prior art static input circuit 10 having hysteresis. Input circuit 10 includes an inverter stage 12 having first, second and third series connected field effect transistors (FETs) $Q_1$, $Q_2$ and $Q_3$. FET $Q_1$ is a depletion-type transistor device, and FETs $Q_2$ and $Q_3$ are enhancement-type devices. The gate and source electrodes of FET $Q_1$ are connected together with the drain electrode of FET $Q_2$ at the output terminal 14 of inverter stage 12. The gate electrodes of each of FETs $Q_2$ and $Q_3$ are connected together to comprise the circuit input terminal IN. The source electrode of FET $Q_2$ and the drain electrode of FET $Q_3$ are connected together at a common electrical junction 16. The source electrode of FET $Q_3$ is connected to a supply of reference potential, such as ground. The conduction path of another enhancement-type FET $Q_4$ is connected between the drain electrode of FET $Q_1$ and the common electrical junction 16, whereby FET $Q_4$ is connected in electrical parallel with the series connected conduction paths of FETs $Q_1$ and $Q_2$. The gate electrode of FET $Q_4$ is connected to the output terminal 14 of inverter stage 12. Output terminal 14 of inverter stage 12 also forms the output terminal OUT of the prior art input circuit 10.

A brief description of the operating characteristics of the prior art input circuit 10 of FIG. 2 is provided below. FETs $Q_2$ and $Q_3$ are typically selected with relatively wide channel widths, because the input signals (e.g. TTL logic level signals) that are applied to the circuit input terminal IN frequently have both relatively low voltage levels and a narrow voltage swing. Therefore, FETs $Q_2$ and $Q_3$ are provided with relatively high parasitic capacitance, so as to undesirably load inverter stage output terminal 14. As a result, the operating speed of the circuit output terminal OUT is increasingly slowed. Moreover, inasmuch as input FETs $Q_2$ and $Q_3$ are connected in electrical series, a relatively large amount of space is consumed in order to fabricate inverter 12.

Figure 3:
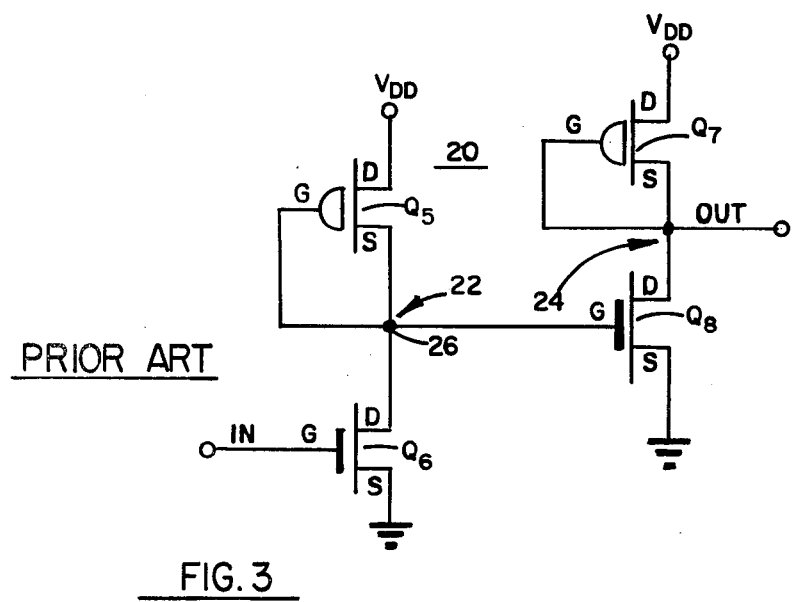

Another example of a prior art static input circuit 20 is that illustrated in FIG. 3 of the drawings. The prior art input circuit 20 includes a pair of series connected inverter stages 22 and 24. First inverter stage 22 includes a pair of series connected field effect transistors (FETs) $Q_5$ and $Q_6$. FET $Q_5$ is a depletion-type transistor device, and FET $Q_6$ is an enhancement-type transistor device. The gate and source electrodes of FET $Q_5$ are connected together with the drain electrode of FET $Q_6$ at the output terminal 26 of inverter stage 22. The drain electrode of FET $Q_5$ is connected to a supply of relatively positive reference potential, designated $V_{DD}$. The source electrode of FET $Q_6$ is connected to a supply of relatively negative reference potential, such as ground. The gate electrode of FET $Q_6$ comprises the input terminal IN of the input circuit 20. Second inverter stage 24 also includes a pair of series connected FETs $Q_7$ and $Q_8$. FET $Q_7$ is a depletion-type transistor device, and FET $Q_8$ is an enhancement-type transistor device. The gate and source electrodes of FET $Q_7$ are connected together with the drain electrode of FET $Q_8$ at the output terminal OUT of circuit 20. The drain electrode of FET $Q_7$ is connected to the $V_{DD}$ supply of reference potential. The source electrode of FET $Q_8$ is connected to ground. The gate electrode of FET $Q_8$ is connected to the output terminal 26 of first inverter stage 22.

A brief description of the operating characteristics of the prior art input circuit 20 of FIG. 3 is provided below. However, for a more detailed understanding of the nature and operation of input circuit 20, reference may be made to U.S. Pat. No. 3,969,633 issued July 13, 1976. The channel width and length of FETs $Q_5$ and $Q_6$ of first inverter stage 22 determine the respective on-resistances of these transistor devices. In order to obtain the best (i.e. most clearly distinguishable from one another) logic level signals at the output terminal 26 of inverter stage 22 relative to those at the input terminal IN of input circuit 20, the on-resistances of FETs $Q_5$ and $Q_6$ are ratioed with respect to one another. By way of example, if a 2.0 volt d.c. signal (i.e. indicative of a relatively poor TTL logic level 1 or true signal) is applied to the circuit input terminal IN, inverter output terminal 26 is driven to a voltage approximating ground (i.e. indicative of a relatively good TTL logic level 0 or false signal) via the conduction path of FET $Q_6$, which voltage depends upon the ratio of the on-resistance of FET $Q_5$ to that of FET $Q_6$. However, this same ratio of on-resistances between FET $Q_5$ and FET $Q_6$ will also produce a relatively poor logic level 1 at inverter output terminal 26, when a 0.8 volt d.c. signal (i.e. indicative of a relatively poor TTL logic level 0) is applied to the circuit input terminal IN, assuming the worse case device parameters (e.g. threshold voltages, channel widths and channel mobilities) of FETs $Q_5$ and $Q_6$. More particularly, if the turn-on threshold voltage of FET $Q_6$ is less than the 0.8 volt signal that is applied to the circuit input terminal IN, FET $Q_6$ is turned on at least slightly. Therefore, the inverter output terminal 26 cannot be driven to the full $V_{DD}$ reference supply via the conduction path of FET $Q_5$. Hence, the prior art input circuit 20 may become inoperable when including an input FET $Q_6$ having a low turn-on threshold voltage. If the on-resistance of FET $Q_5$ is very much greater than that of FET $Q_6$ (i.e. representative of a large ratio), the voltage level at inverter output terminal 26 may not be sufficient to enable a logic level 1 to be distinguished from a logic level 0. As a consequence, the second inverter stage 24 must also be particularly ratioed, so that a relatively poor logic level 1 at the output terminal thereof (i.e. at the gate electrode of FET $Q_8$) will cause the output terminal OUT of circuit 20 to be driven to a good MOS logic level 0 via the conduction path of FET $Q_8$. That is, as a result of the configuration of the prior art input circuit 20, large transistor ratios are required for devices $Q_5$–$Q_8$ of both inverter stages 22 and 24, which undesirably increases space consumption and s ows the circuit operating speed. Moreover, each of the depletion-type FETs $Q_5$ and $Q_7$ typically has a low resistance, if high speed circuit operation is required for high frequency operation. What is more, in order to obtain good MOS logic level signals at the circuit output terminal OUT, each of the enhancement-type FETs $Q_6$ and $Q_8$ may be 25 times larger than their corresponding depletion-type FETs (i.e. FETs $Q_5$ and $Q_7$, respectively).

Figure 4:
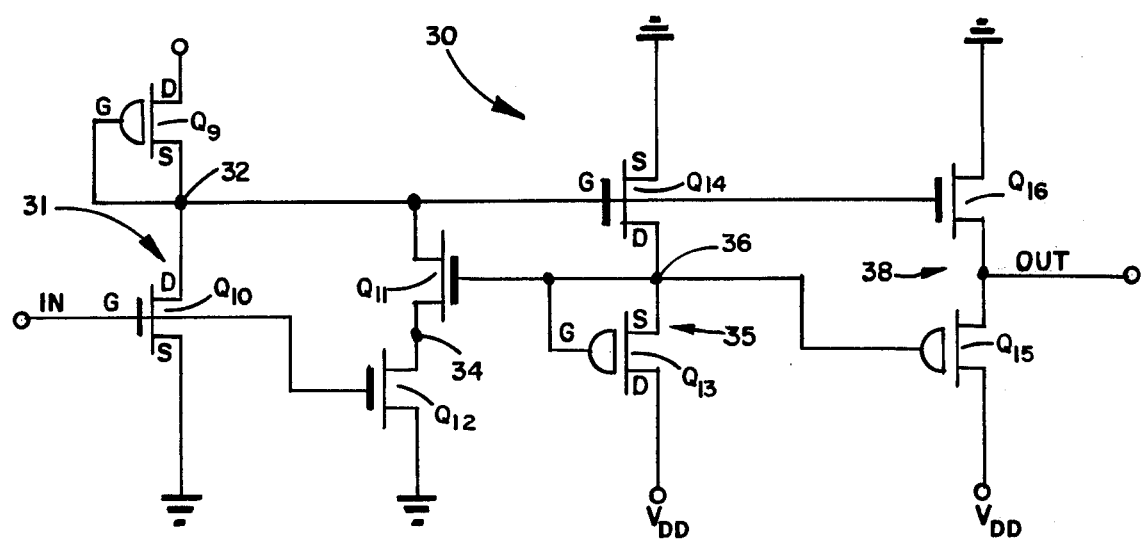
FIG. 4 shows the improved, static MOS input circuit, having hysteresis, which circuit forms the present invention.

FIG. 4 of the drawings illustrates an improved, static MOS input circuit 30, having hysteresis, which input circuit forms the present invention. The input circuit 30 includes a first inverter stage 31 comprising a pair of series connected FETs $Q_9$ and $Q_{10}$. FET $Q_9$ is a depletion-type transistor device, and FET $Q_{10}$ is an enhancement-type transistor device. The gate and source electrodes of FET $Q_9$ are connected together with the drain electrode of FET $Q_{10}$ at the output terminal 32 of first inverter stage 31. The drain electrode of FET $Q_9$ is connected to a supply of relatively positive reference potential (e.g. 5 volts d.c.), designated $V_{DD}$. The source electrode of FET $Q_{10}$ is connected to a supply of relatively negative reference potential, such as ground. The gate electrode of FET $Q_{10}$ is connected to the input terminal IN of circuit 30. Input circuit 30 includes another pair of series connected FETs $Q_{11}$ and $Q_{12}$. The series connected conduction paths of FETs $Q_{11}$ and $Q_{12}$ are connected between the output terminal 32 of inverter 31 and ground and, therefore, in electrical parallel with the conduction path of FET $Q_{10}$. FETs $Q_{11}$ and $Q_{12}$ are both enhancement-type transistor devices. The gate electrode of FET $Q_{11}$ is connected to the output terminal 36 of a second inverter stage 35. The gate electrode of FET $Q_{12}$ is connected to the input terminal IN of circuit 30 (with the gate electrode of FET $Q_{10}$). An electrical junction 34 is formed between the conduction paths of FETs $Q_{11}$ and $Q_{12}$. Input circuit 30 includes a second inverter stage 35 comprising a pair of FETs $Q_{13}$ and $Q_{14}$, the respective conduction paths of which are connected in electrical series between the $V_{DD}$ and ground reference supplies. FET $Q_{13}$ is a depletion-type transistor device, and FET $Q_{14}$ is an enhancement-type transistor device. The gate and source electrodes of FET $Q_{13}$ are connected together with the drain electrode of FET $Q_{14}$ at the output terminal 36 of second inverter stage 35 (with the gate electrode of FET $Q_{11}$). The gate electrode of FET $Q_{14}$ is connected to the output terminal 32 of first inverter stage 31. Therefore, first and second inverter stages 31 and 35 are connected in series relative to one another. Input circuit 30 includes a third inverter stage 38 comprising a pair of FETs $Q_{15}$ and $Q_{16}$, the respective conduction paths of which are connected in electrical series between the $V_{DD}$ and ground reference supplies. FET $Q_{15}$ is a depletion-type transistor device, and FET $Q_{16}$ is an enhancement-type transistor device. The gate electrode of FET $Q_{15}$ is connected to the output terminal 36 of second inverter stage 35 so as to be driven therefrom. The gate electrode of FET $Q_{16}$ is connected to the output terminal 32 of first inverter stage 31 (with the gate electrode of FET $Q_{14}$) so as to be driven therefrom. It is to be understood, however, that the gate electrodes of FETs $Q_{15}$ and $Q_{16}$ may be alternatively connected to the output terminals 32 and 36 of the first and second inverter stages 31 and 35, respectively. A common electrical junction formed between the series connected conduction paths of FETs $Q_{15}$ and $Q_{16}$ forms the output terminal OUT of the present input circuit 30.

In accordance with the present invention, the operating characteristics of the improved static input circuit 30 of FIG. 4, which circuit is suitable for accepting TTL logic level input signals, is disclosed below. FETs $Q_9$ and $Q_{10}$, which form first inverter stage 31, have their on-resistances ratioed relative to one another in order to provide, by way of a first example, a good logic level 1 signal at inverter output terminal 32 in response to the application of a 0.8 volt d.c. input signal (i.e. a poor TTL logic level 0) at the input terminal IN of circuit 30. During this first example, FET $Q_{12}$ is essentially rendered non-conductive, inasmuch as the gate electrode thereof is connected to the circuit input terminal IN to also receive the logic level 0 input signal. However, each of FETs $Q_{14}$ and $Q_{16}$ are rendered conductive, inasmuch as the respective gate electrodes thereof are connected to the output terminal 32 of first inverter stage 31 so as to receive the logic level 1 output signal therefrom. Hence, each of the output terminal 36 of second inverter stage 35 and the output terminal OUT of the presently described input circuit 30 is driven approximately to ground (i.e. a good MOS logic level 0) during the first example via the conduction paths of FETs $Q_{14}$ and $Q_{16}$, respectively. Therefore, FET $Q_{11}$ is rendered non-conductive, inasmuch as the gate electrode thereof is connected approximately to ground at the output terminal 36 of inverter stage 35. Since FET $Q_{11}$ is rendered non-conductive, the output terminal 32 of inverter stage 31 and the gate electrode of FET $Q_{14}$ can be driven more positively towards the $V_{DD}$ reference supply via the conduction path of pull-up FET $Q_9$, whereby output terminal 32 is driven to a better logic level 1 signal. In other words, the effective on-resistance ratio of the first inverter stage FETs $Q_9$ and $Q_{10}$ is reduced, inasmuch as FET $Q_{11}$ is rendered non-conductive by virtue of a good logic level 0 at the output terminal 36 of second inverter stage 35. Should the turn-on threshold voltage of FET $Q_{10}$ be less than the 0.8 volt input signal applied to the gate electrode thereof via circuit input terminal IN, then FET $Q_{10}$ is turned on at least slightly. Therefore, with FET $Q_{10}$ conducting slightly and the on-resistance of FET $Q_9$ ratioed to that of FET $Q_{10}$, the inverter stage output terminal 32 can still be driven to an adequate logic level 1 signal via the conduction path of pull-up FET $Q_9$.

By way of a second example, when the input signal that is applied to the input terminal IN of the presently disclosed circuit 30 switches from 0.8 volts d.c. to 2.0 volts d.c. (i.e. a poor TTL logic level 1), FETs $Q_{10}$ and $Q_{12}$ are rendered conductive, inasmuch as the respective gate electrodes thereof are connected to input terminal IN to receive the logic level 1 signal thereat. Hence, each of the first inverter stage output terminal 32 and electrical junction 34 is driven towards ground via the conduction paths of FETs $Q_{10}$ and $Q_{12}$, respectively, and FETs $Q_{14}$ and $Q_{16}$ are rendered non-conductive. During the second example, the ratio of the on-resistance of FET $Q_9$ to that of FET $Q_{10}$ would typically provide first inverter stage output terminal 32 with a relatively poor logic level 0 signal. However, by virtue of the presently disclosed input circuit configuraion, as inverter output terminal 32 is driven less positive (i.e. towards ground), the output terminal 36 of second inverter stage 35 is driven more positive (towards $V_{DD}$) via the conduction path of pull-up FET $Q_{13}$. Therefore, FET $Q_{11}$ is eventually rendered conductive during the second example, inasmuch as the gate electrode thereof is connected to second inverter stage output terminal 36, whereby the logic level 0 (i.e. ground) signal is reinforced at the output terminal 32 of first inverter stage 31 via the series connected conduction paths of FETs $Q_{11}$ and $Q_{12}$.

Reinforcing the logic level of first inverter stage output terminal 32 by means of a positive feedback path including FET $Q_{14}$, second inverter stage output terminal 36, and FET $Q_{11}$ has the advantageous effect of increasing the on-resistance ratio of first inverter stage 31. Because the first inverter stage 31 encounters a varying on-resistance ratio during the second example (i.e. a numerically low ratio when a logic level 0 signal is applied to input terminal IN and a numerically high ratio when a logic level 1 signal is applied to input terminal IN), the present circuit 30 develops hysteresis and resulting noise immunity at input terminal IN. That is, the on-resistances of the series connected FETs $Q_{11}$ and $Q_{12}$ and the on-resistance of FET $Q_{10}$ create two parallel conduction paths, whereby first inverter stage output terminal 32 is clamped to ground when a logic level 1 signal is applied to circuit input terminal IN. The amount of hysteresis produced depends upon the on-resistance of input FET $Q_{10}$ (which is at least slightly conductive in both the first and second examples) with respect to that of the series connected FETs $Q_{11}$ and $Q_{12}$. By virtue of the series connection of FETs $Q_{11}$ and $Q_{12}$ in electrical parallel with FET $Q_{10}$, the hysteresis automatically adjusts the turn-on threshold voltage of input FET $Q_{10}$ depending upon the level of the input signal that is applied to circuit input terminal IN. Moreover, the circuit noise immunity is increased. Therefore, FET $Q_{10}$ may be provided with a relatively narrow width and a low parasitic capacitance so as to increase the circuit operating speed at the input terminal 32 of first inverter stage 31.

When the input signal that is applied to the input terminal IN of circuit 30 ultimately returns to the 0.8 volt level, feedback FET $Q_{11}$ is, accordingly, rendered non-conductive. As a result, the feedback path between inverter output terminals 32 and 36 is opened so as to thereby prevent lockup.

As will be recognized by those skilled in the art, voltage signals at inverter output terminals 32 and 36 provide push-pull drive for third inverter stage FETs $Q_{16}$ and $Q_{15}$, respectively. What is more, second inverter output terminal 36 provides good logic level signals at the gate electrode of feedback FET $Q_{11}$ to enable the reinforcement of the logic level at first inverter output terminal 32. Therefore, by virtue of the circuit configuration for the improved input circuit 30 of FIG. 4, an extended noise margin (i.e. hysteresis) is achieved by means of positive feedback, so that MOS output logic level 0 and 1 signals are clearly distinguishable from one another at the circuit output terminal OUT in response to input logic level signals having a relatively narrow voltage swing. Another significant accomplishment of the present invention is to provide the output terminal 32 of first inverter stage 31 with improved logic level signals relative to those formerly achievable from the prior art circuit configurations (such as those illustrated in FIGS. 2 and 3). By way of a particular example, it has been found that by applying a slow ramping input signal to the input terminal IN of input circuit 30, the magnitude of the respective trigger points (i.e. the voltage at which the output terminal OUT switches from a logic level 0 to a logic level 1, and vice versa) of circuit 30 are 1.7 volts for a positive going input signal and 1.4 volts for a negative going input signal. Hence, an input signal having a 0.3 volt wide noise rejection hysteresis band may be provided at the trigger point of the presently disclosed input circuit 30.

It will be apparent that while a preferred embodiment of the invention has been shown and described, various modifications and changes may be made without departing from the true spirit and scope of the invention. For example, by selectively changing the on-resistance of FETs $Q_9$, $Q_{10}$, $Q_{11}$ and $Q_{12}$, the present input circuit 30 can have particular application as an input receiver to receive input signals having TTL logic levels, or the like. By selecting the proper channel dimensions (i.e. on-resistances) for FETs $Q_9$–$Q_{12}$, input circuit 30 can be modified to also receive input signals from the output terminal of a differential amplifier (not shown). Inasmuch as a moderate gain is provided at output terminal OUT, input circuit 30 can also be adapted to operate in the capacity of a level shifter.

Having thus set forth a preferred embodiment of the present invention, what is claimed is:

1. A metal oxide semiconductor input circuit suitable for receiving relatively low voltage TTL input signals having a narrow voltage swing and for providing MOS level output signals that are clearly distinguishable from one another, said input circuit including:
   a first inverter stage having respective input and output terminals, the input terminal of said first inverter stage connected to an input terminal of said input circuit,
   a second inverter stage having respective input and output terminals,
   a third inverter stage having respective input and output terminals, the output terminal of said third inverter stage comprising the output terminal of said input circuit,
   each of said first, second and third inverter stages comprising the series connection of an enhancement and a depletion-type field effect transistor,
   the output terminal of said first inverter stage connected to each of the input terminal of said second inverter stage and to the gate electrode of one of the enhancement or depletion-type field effect transistors that forms said third inverter stage;
   the output terminal of said second inverter stage connected to the gate electrode of the other of said enhancement or depletion-type field effect transistors that forms said third inverter stage, whereby said third inverter stage transistors have a push-pull drive configuration relative to the output terminals of said first and second inverter stages;
   first and second series connected enhancement-type field effect transistors, the series connection of said first and second enhancement-type transistors connected in electrical parallel with the enhancement-type field effect transistor that forms said first inverter stage so as to control the turn-on threshold point of said first inverter stage enhancement-type transistor;
   said gate electrode of a first of said first and second series connected enhancement-type field effect transistors is connected to the output terminal of said second inverter stage, and the gate electrode of the second of said first and second series connected enhancement-type field effect transistors is connected to the input terminal of said input circuit;
   said series connection of said first and second enhancement-type field effect transistors is connected between the output terminal of said first inverter stage and a supply of reference potential; and
   said input circuit providing a feedback path from the output terminal of said second inverter stage to the gate electrode of one of said series connected first and second enhancement-type field effect transistors via said second inverter stage, said feedback path controlling the conductivity of the series connection of said first and second enhancement-type field effect transistors so as to selectively clamp the output terminal of said first inverter stage to said supply of reference potential when said feedback path is activated.

2. The input circuit recited in claim 1, wherein the gate electrode and one conduction path electrode of the depletion-type field effect transistor that forms said first inverter stage are connected together at the output terminal of said first inverter stage.

3. The input circuit recited in claim 1, wherein the gate electrode and one conduction path electrode of the depletion-type field effect transistor that forms said second inverter stage are connected together at the output terminal of said second inverter stage.

4. The input circuit recited in claim 1, wherein said first and second inverter stages are connected in electrical series with one another.

* * * * *